(12) United States Patent
Tatsumi et al.

(10) Patent No.: US 6,229,281 B1
(45) Date of Patent: May 8, 2001

(54) PACKED BATTERY EXAMINING APPARATUS

(75) Inventors: Hiroyuki Tatsumi; Toshiaki Okuma, both of Osaka; Tatsuya Fuchizaki, Nishinomiya; Takahiro Murakami, Sumoto, all of (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/446,127
(22) PCT Filed: Jun. 23, 1998
(86) PCT No.: PCT/JP98/02831
§ 371 Date: Apr. 7, 2000
§ 102(e) Date: Apr. 7, 2000
(87) PCT Pub. No.: WO99/00721
PCT Pub. Date: Jan. 7, 1999

(30) Foreign Application Priority Data

Jun. 27, 1997 (JP) .................................. 9-171336
Aug. 21, 1997 (JP) .................................. 9-224571

(51) Int. Cl.⁷ .................................. H01M 10/46
(52) U.S. Cl. .................................. 320/106
(58) Field of Search .................................. 320/106, 110, 320/112, 128, 132, 149

(56) References Cited

U.S. PATENT DOCUMENTS

| 4,885,523 | * | 12/1989 | Koenck . |
| 5,206,097 | * | 4/1993 | Burns et al. . |
| 5,399,446 | * | 3/1995 | Takahashi . |
| 5,534,765 | * | 7/1996 | Kreisinger et al. . |
| 5,694,024 | * | 12/1997 | Dias et al. . |

FOREIGN PATENT DOCUMENTS

| 7-230344 | 8/1995 | (JP) . |
| 8-314583 | 11/1996 | (JP) . |
| 8-329986 | 12/1996 | (JP) . |
| 10-149842 | 6/1998 | (JP) . |

* cited by examiner

*Primary Examiner*—Edward H. Tso
(74) *Attorney, Agent, or Firm*—Arent Fox Kintner Plotkin & Kahn, PLLC

(57) ABSTRACT

A controller comprises means for transmitting to an interface device, when predetermined data for examination must be acquired from a communication and charge or discharge controller in a packed battery which is an examination object in the step of performing examination processing, a communication command for acquiring the data for examination, the interface device comprises means for converting, when it receives the communication command from the controller, the received communication command into protocol data corresponding to a communication protocol used for communication with the packed battery which is an examination object, means for transmitting the obtained protocol data to the communication and charge or discharge controller in the packed battery which is an examination object, and means for receiving the data for examination which has been fed from the communication and the charge or discharge controller in the packed battery and transmitting the data for examination to the controller.

5 Claims, 17 Drawing Sheets

FIG. 11

| No. | INSTRUCTION | DESCRIPTION |
|---|---|---|
| 1 | # | COMMENT ROW |
| 2 | CONSOLE | DISPLAY CHARACTER STRING DESIGNATED BY ARGUMENT ON SCREEN |
| 3 | WAIT | TEMPORARILY STOP PROGRAM |
| 4 | MATH | EXECUTE OPERATION (ARITHMETIC OPERATION) DESIGNATED BY ARGUMENT |
| 5 | TEST | MAKE EXAMINATION |
| 6 | REPORT | OUTPUT DESIGNATED CONTENTS TO COMMUNICATION TEST RESULT FILE |
| 7 | EXIT | TERMINATE TEST |
| 8 | IF~ELSE~ENDIF | BRANCH PROCESSING DEPENDING ON CONDITIONS |
| 9 | GO | UNCONDITIONALLY BRANCH TO LABEL DESIGNATED BY ARGUMENT |
| 10 | LABEL | SET LABEL |
| 11 | R LABEL | SET LABEL FOR EXTERNAL TRIGGER PROCESSING |
| 12 | GRAPH | DISPLAY GRAPH OF VARIABLE |
| 13 | EM INIT | BRING I/F BOARD INTO INITIAL STATE |
| 14 | EM POWER | SET STATE OF POWER SUPPLY |
| 15 | EM SET RESIST | SET STATE OF LOAD |
| 16 | EM SET RECOG | SET STATE OF IDENTIFICATION SIGNAL |
| 17 | EM SET DATA | SET STATE OF DATA LINE |
| 18 | EM SET CLK | SET STATE OF CLOCK LINE |
| 19 | EM SET RESET | SET STATE OF RESET TERMINAL |
| 20 | EM READ AD | ACQUIRE AD VALUE |
| 21 | EM SET IO | SET STATE OF IO |
| 22 | EM READ IO | ACQUIRE STATE OF IO |
| 23 | EM IBP | REQUEST TO ESTABLISH COMMUNICATION WITH PACKED BATTERY |
| 24 | EM EX IBP | DEFINE PROCESSING OF EXTERNAL TRIGGER |
| 25 | GP INIT | INITIALIZE GP-IB EQUIPMENT |
| 26 | GP SET POWER | SET GP-IB POWER SUPPLY |
| 27 | GP READ PV | READ GP-IB POWER SUPPLY VOLTAGE |
| 28 | GP READ PA | READ GP-IB POWER SUPPLY CURRENT |
| 29 | GP SET REAIST | SET GP-IB LOAD |
| 30 | GP READ RV | READ GP-IB LOAD VOLTAGE |
| 31 | GP READ RA | READ GP-IB LOAD CURRENT |
| 32 | GP EXIT | TERMINATE CONTROL OF GP-IB EQUIPMENT |
| 33 | GP WRITE | TRANSMIT COMMAND TO GP-IB EQUIPMENT |
| 34 | GP READ | READ READ BACK DATA OF GP-IB EQUIPMENT |

FIG. 12

```
# EXAMINATION START MESSAGE
CONSOLE COMFIM  "START CONFIRMATION AND EXAMINATION OF VOLTAGE PRECISION"
# INITIALIZE I/F BOARD
EM INIT
# SET CONNECTION DETECTING TERMINAL 0 TO LOW
EM SET RECOG SIG0 LOW

# AD CONVERSION
EM READ AD AN0 $x1
MATH $x1=$x1*5
CONSOLE WATCH $x1

# IBP COMMUNICATION~ISSUE VOLTAGE COMMAND~
EM IBP Voltage $x2
CONSOLE WATCH $x2

# COMPARISON EXAMINATION BETWEEN MEASURED VALUE AND CONTENTS OF COMMUNICATION
TEST $y : $x2==$x1 RATEE0.05
IF $y
CONSOLE COMFIM  "ERROR BETWEEN VOLTAGE VALUES IS WITHIN 5.0%"
ELSE
CONSOLE COMFIM  "ERROR BETWEEN VOLTAGE VALUES EXCEEDS 5.0%"
ENDIF
```

FIG. 18

```
INITIALIZATION
# EXAMINATION START MESSAGE
CONSOLE COMFIM "START CONFIRMATION AND EXAMINATION OF
OVER DISCHARGE WARNING"
# INITIALIZE I/F BOARD
EM INIT
# INITIALIZE GP-IB EQUIPMENT
GP INIT
# SET CONNECTION DETECTING TERMINAL 0 TO LOW
EM SET RECOG SIG0 LOW

SET CAPACITY IN ISSUING WARNING
# SET PACKED BATTERY TO ISSUE WARNING IF REMAINING
CAPACITY IS 1000 maH
EM IBP W RemainingCapacity 1000

SET IN CASE WHERE COMMUNICATION IS ESTABLISHED FROM
PACKED BATTERY
# INSERT CONTENTS OF RECEIVING INTO $x2 AND REGISTER
THE SAME TO EXECUTE R LABEL L1 WHEN ALARM WARNING(0×16)
IS RECEIVED
EM EX IBP AlarmWarning $x2 L1

DISCHARGE
CONSOLE MESSAGE "START DISCHARGE"
# SET GP-IB LOAD
GP SET RESIST ON 2.0
# LOAD ON
EM SET RESIST ON
# START DISCHARGE LOOP
LABEL LOOP
# ACQUIRE REMAINING CAPACITY
EM IBP RemainingCapacity $x1
TEST $y : $x1 >990
IF $y
GO LOOP
ENDIF PROCESSING IN CASE WHERE WARNING HAS NOT BEEN ISSUED YET
CONSOLE COMFIM "ALTHOUGH REMAINING CAPACITY <990maH,
NO ALARM WARNING IS ISSUED"
GO END PROCESSING IN CASE WHERE WARNING IS ISSUED
R LABEL L1 START
# ACQUIRE REMAINING CAPACITY
EM IBP RemainingCapacity $x1
# CONFIRM WHETHER OR NOT WARNING IS ISSUED IN PROPER
REMAINING CAPACITY
TEST $y : $x1 == 1000 VAL 10
IF $y
CONSOLE COMFIM  WARNING IS CORRECTLY ISSUED WHEN REMAINING
CAPACITY IS 1000
ELSE
CONSOLE COMFIM  WARNING IS NOT CORRECTLY ISSUED WHEN REMAINING
CAPACITY IS 1000
ENDIF
GO END
R LABEL L1 END

TERMINATION PROCESSING
LABEL END

EXIT
```

PACKED BATTERY EXAMINING APPARATUS

TECHNICAL FIELD

The present invention relates to an apparatus for examining a packed battery carried in a host device such as a notebook-sized personal computer or a potable telephone and having the function of communicating with the host device.

BACKGROUND ART

A packed battery carried in a host device such as a notebook-sized personal computer or a portable telephone and having the function of communicating with the host device has been known. Such a packed battery generally comprises battery cells (a secondary battery) and a substrate having a microcomputer for controlling communication and charge or discharge carried therein.

A protocol and a communication command which are used for communication between this type of packed battery and host devices are not standardized. Therefore, in the present condition, a person who develops a packed battery must develop the packed battery in conformity with the specification of each of the host devices.

Since the development of the packed battery and the development of the host device simultaneously progress, a person who develops the packed battery must debugs a communication function after fabricating a dedicated communication jig corresponding to the ordered type thereof. Therefore, a period during which the communication function is debugged is delayed, so that the speed at which the packed battery is developed is low.

An object of the present invention is to provide a packed battery examining apparatus capable of examining packed batteries which differ in type.

An object of the present invention is to provide a packed battery examining apparatus capable of shortening a period during which a packed battery is developed.

DISCLOSURE OF THE INVENTION

A first packed battery examining apparatus according to the present invention comprises an interface device connected to a packed battery which is an examination object and a controller connected to the interface device for performing examination processing, which is characterized in that the controller comprises means for transmitting to the interface device, when predetermined data for examination must be acquired from a communication and charge or discharge controller in the packed battery which is an examination object in the step of performing the examination processing, a communication command for acquiring the data for examination, and the interface device comprises means for converting, when it receives the communication command for acquiring the data for examination from the controller, the received communication command into protocol data corresponding to a communication protocol used for communication with the packed battery which is an examination object, means for transmitting the obtained protocol data to the communication and charge or discharge controller in the packed battery which is an examination object, and means for receiving the data for examination which has been fed from the communication and charge or discharge controller in the packed battery and transmitting the data for examination to the controller.

It is preferable that the controller performs the examination processing in accordance with an examination procedure file for defining the procedure for examination processing. In this case, it is preferable that the communication command for acquiring the predetermined data for examination from the communication and charge or discharge controller in the packed battery which is an examination object is described by a common communication instruction irrespective of the type of the packed battery in the examination procedure file. In a case where the communication command is described by the common communication instruction irrespective of the type of the packed battery, the controller converts, when the communication instruction described in the examination procedure file is transmitted to the interface device, the communication instruction into a communication command corresponding to a command system corresponding to the packed battery which is an examination object, and transmits the obtained communication command to the interface device.

A second packed battery examining apparatus according to the present invention comprises an interface device connected to a packed battery which is an examination object and a controller connected to the interface device for performing examination processing, which is characterized in that a communication and charge or discharge controller in the packed battery which is an examination object comprises means for generating, when the packed battery which is an examination object enters a predetermined state, data for state confirmation indicating that the packed battery enters the predetermined state, the controller comprises means for transmitting, when the data for state confirmation which is generated by the communication and charge or discharge controller in the packed battery which is an examination object must be acquired in the step of performing the examination processing, a communication command for acquiring the data for state confirmation to the interface device, and the interface device comprises means for receiving and holding data for examination which is generated from the communication and charge or discharge controller in the packed battery which is an examination object, and means for transmitting, when it receives the communication command for acquiring the data for state confirmation from the controller, the preserved data for state confirmation to the controller.

In the first or second packed battery examining apparatus, the controller is constituted by a personal computer, for example. The controller and the interface device may be constituted by the same personal computer.

BRIEF DESCRIPTION OF DRAWINGS

FIG. 11 is a table showing an example of instruction words of a simple language used for an examination procedure file;

FIG. 12 is a schematic view showing an example of an examination procedure file for examining a battery voltage;

FIG. 18 is a schematic view showing an example of an examination procedure file for confirming and examining an over discharge warning;

BEST MODE FOR CARRYING OUT THE INVENTION

Figure 1:
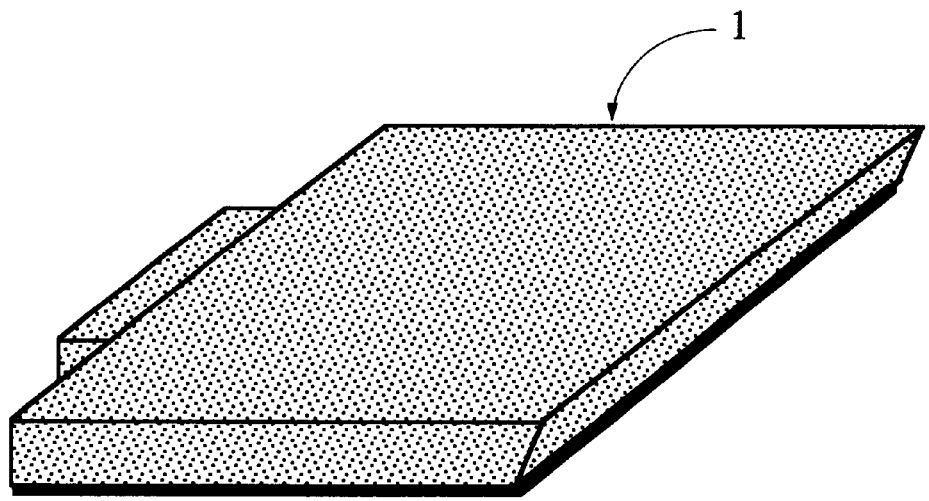
FIG. 1 is a perspective view showing the appearance of a packed battery.

Referring now to the drawings, an embodiment of the present invention will be described.

[1] Description of Configuration of Packed Battery

Figure 2:
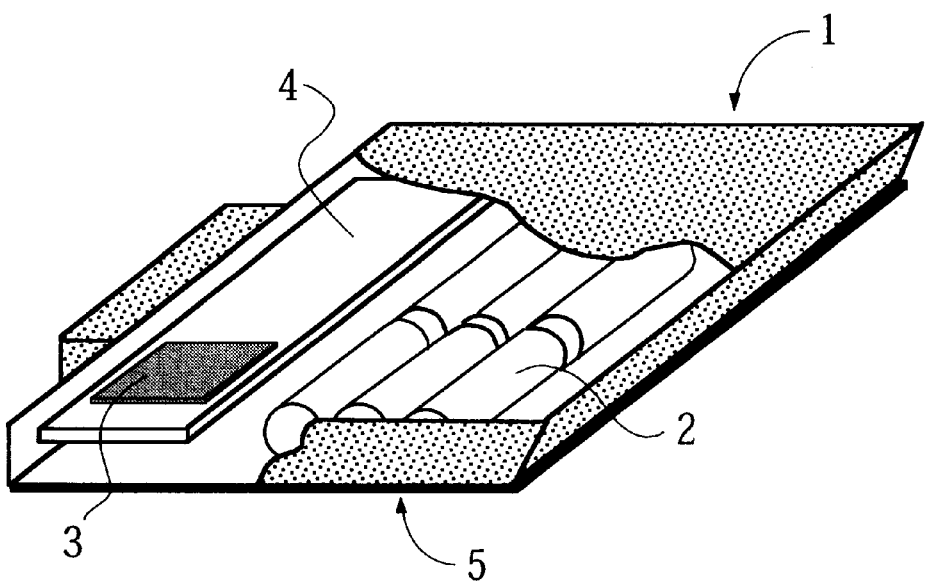
FIG. 2 is a partially cutaway view in perspective showing the configuration of the packed battery.

FIG. 1 illustrates the appearance of a packed battery, and FIG. 2 illustrates the configuration of the packed battery.

In a packed battery 1, a plurality of battery cells (a secondary battery) 2 and a substrate 4 having a microcomputer 3 for controlling communication and charge or discharge carried thereon are contained in a package 5.

[2] Description of Configuration of Packed Battery Examining Apparatus

Figure 3:
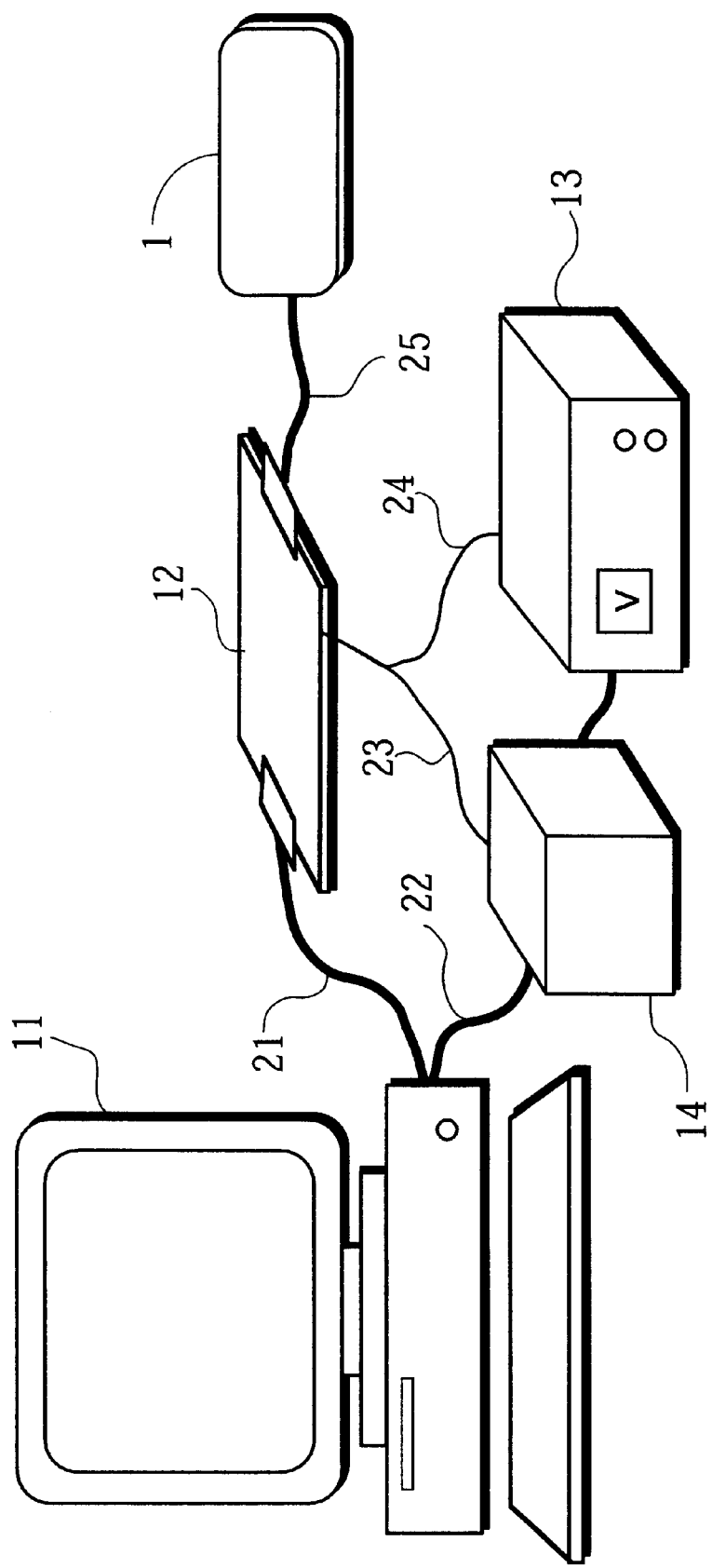
FIG. 3 is a block diagram showing the configuration of a packed battery examining apparatus.

FIG. 3 illustrates the configuration of a packed battery examining apparatus.

The packed battery examining apparatus examines communication with the packed battery and examines the charge or discharge of the packed battery. In the examination of the communication with the packed battery, it is examined whether or not communication is possible and whether or not the contents of the communication are suitable. In the examination of the charge or discharge of the packed battery, it is examined whether or not charge can be controlled or whether or not discharge can be controlled.

The following three types which differ in the protocol and the communication command system shall be known as the type of the packed battery which is an examination object.

(1) Packed battery for A Company

The type of protocol: SMB (Service Message Block) protocol (2) Packed battery for B Company The type of protocol: Synchronous protocol (3) Packed battery for C Company The type of protocol: UART (Universal Asynchronous Receiver Transmitter) protocol The packed battery examining apparatus comprises a personal computer (hereinafter referred to as a PC) 11, an interface board (hereinafter referred to as an I/F board) 12, a power supply 13, and a simulated load 14. The I/F board 12 is connected to the PC 11 through an RS (Recommendation Standard)-232C cable 21. The power supply 13 and the simulated load (an electronic load) 14 are connected to the PC 11 through a GP-IB (General Purpose Interface Bus) communication cable 22, and is connected to the I/F board 12 through cables 23 and 24. The packed battery 1 which is an examination object is connected to the I/F board 12 through a flat cable 25. The I/F board 12 may be contained in the PC 11.

The PC 11 transmits a communication command to the I/F board 12, and controls the power supply 13 and the simulated load 14, for example. The PC 11 stores a command definition file in which the definition of the communication command is described for each of communication command systems used in the three types of packed batteries.

The I/F board 12 converts the communication command received from the PC 11 into protocol data corresponding to the packed battery 1 which is an examination object, to transmit and receive the protocol data to and from the packed battery 1.

The simulated load 14 is used as a host load when the discharge of the packed battery 1 which is an examination object is examined. The power supply 13 is used as a power supply for charging in examining the charge of the packed battery 1.

[3] Description of Configuration of I/F Board

Figure 4:
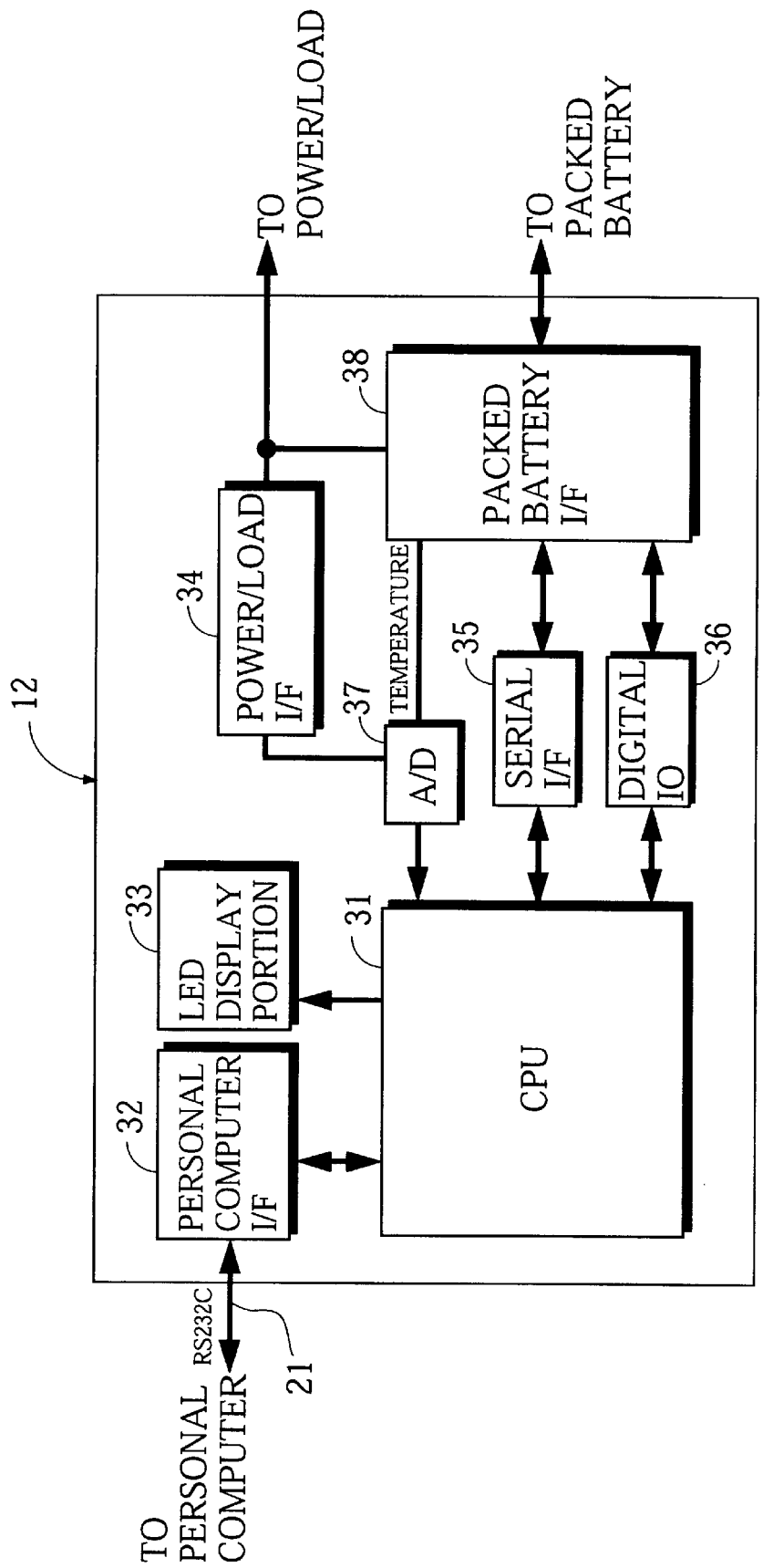
FIG. 4 is a block diagram showing the configuration of an I/F board 12.
Figure 5:
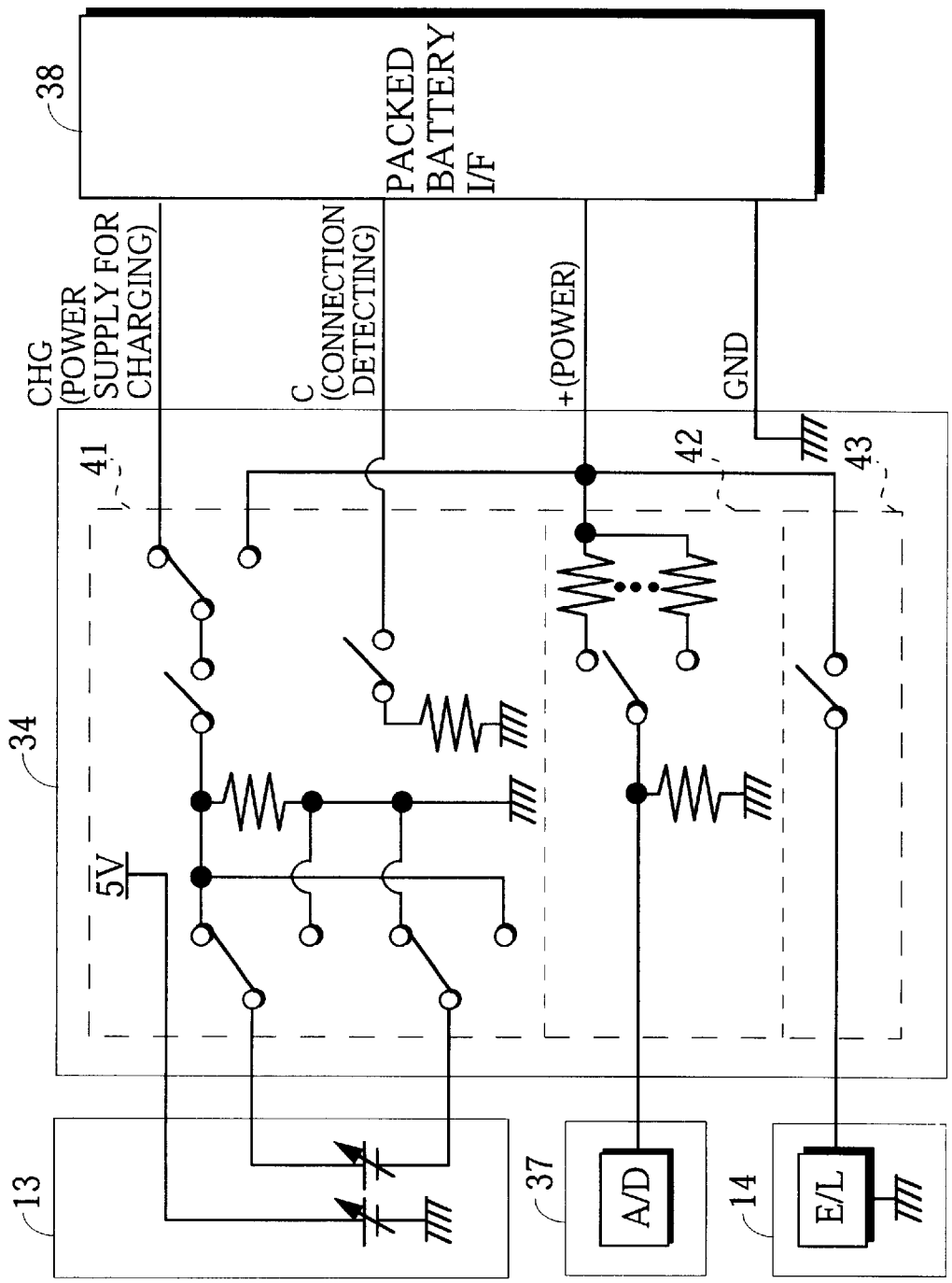
FIG. 5 is a circuit diagram showing a power/load interface potion 34.

FIG. 4 illustrates the configuration of the I/F board 12.

The I/F board 12 comprises a CPU 31, a personal computer interface portion 32, an LED display portion 33, a power/load interface portion 34, a serial interface portion 35, a digital input/output portion 36, an A/D (Analog-to-Digital) conversion portion 37, and a packed battery interface portion 38. The CPU 31, a part of the serial interface portion 35, and a part of the digital input/output portion 36 are constituted by a microcomputer 30 (see FIGS. 6 and 7). The CPU 31 is connected to the PC 11 through the personal computer interface portion 32 and the RS-232C cable 21.

The power/load interface portion 34 comprises a circuit 41 for connecting the power supply 13 to the packed battery 1 at the time of charge examination, a circuit 43 for connecting the cells in the packed battery 1 to the simulated load 13 at the time of discharge examination, and a circuit 42 for feeding a battery voltage of the packed battery 1 to the A/D conversion portion 37.

Figure 6:
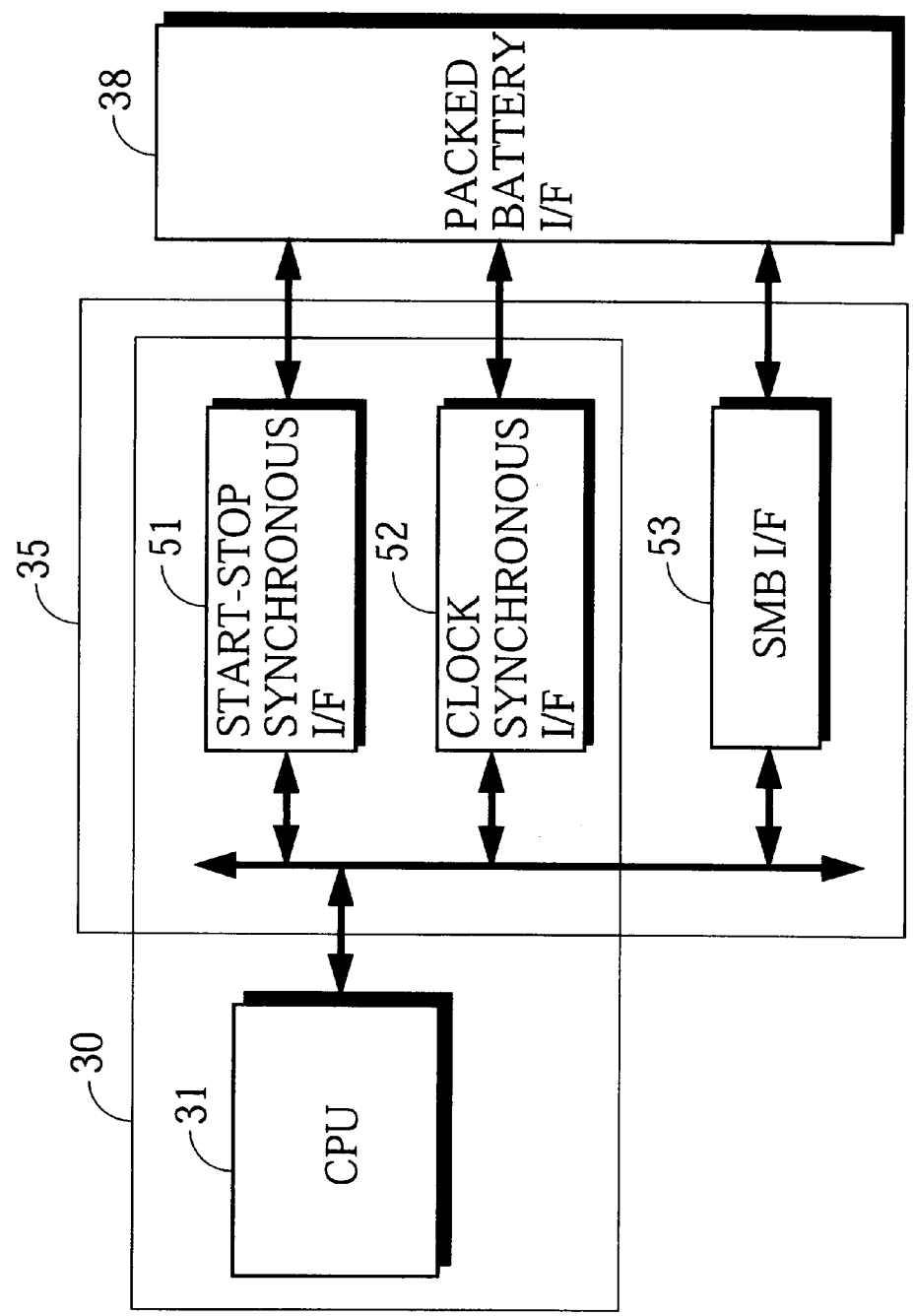
FIG. 6 is a block diagram showing the configuration of a serial interface portion 35.

The serial interface portion 35 comprises a start-stop synchronous interface portion 51, a clock synchronous interface portion 52, and an SMB interface portion ($I^2C$ interface portion) 53, as shown in FIG. 6. The start-stop synchronous interface portion 51 and the clock synchronous interface portion 52 are contained in the microcomputer 30.

The start-stop synchronous interface portion 51 is used when the protocol is the UART protocol. The clock synchronous interface portion 52 is used when the protocol is the synchronous protocol. The SMB interface portion 53 is used when the protocol is the SMB protocol.

Figure 7:
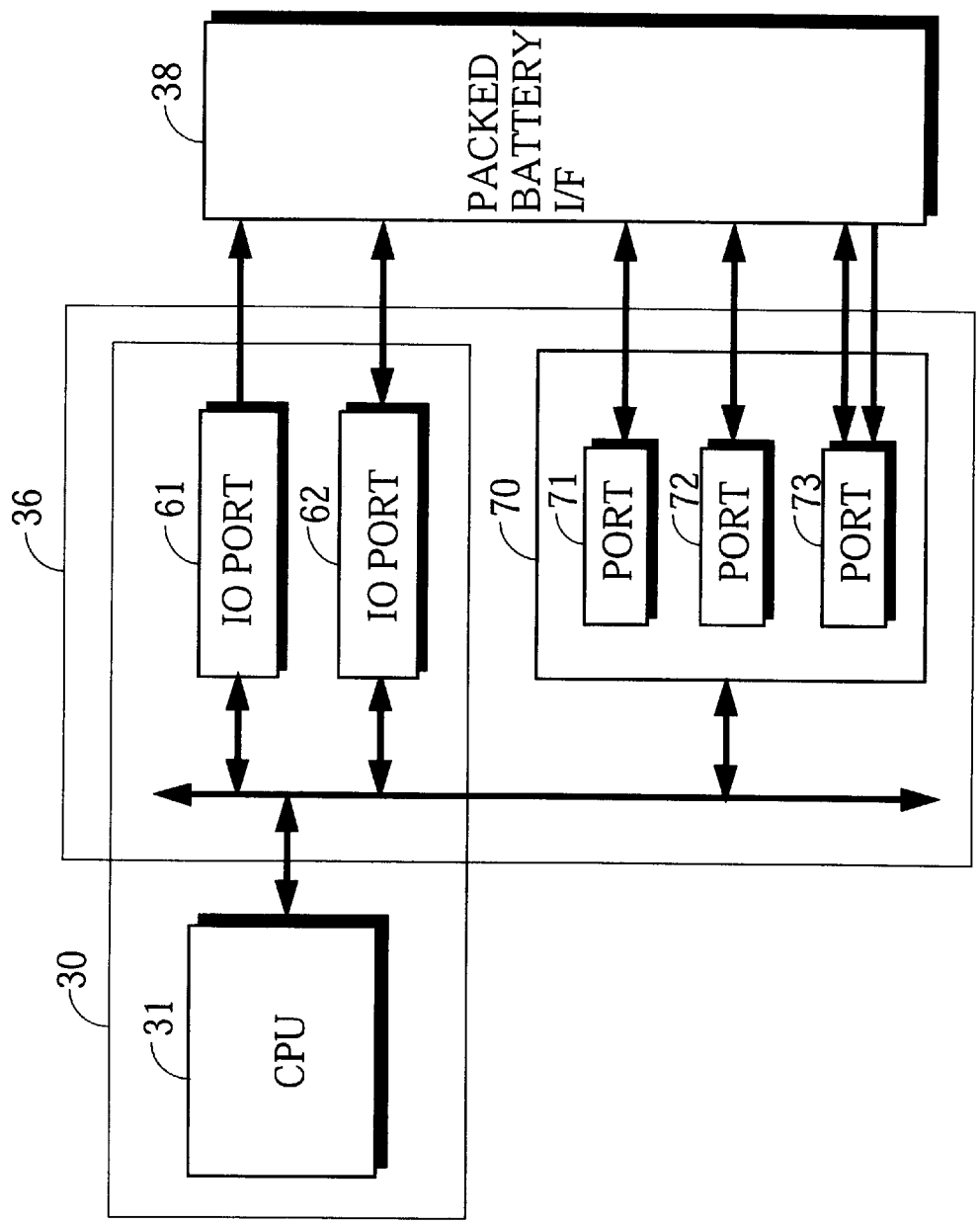
FIG. 7 is a block diagram showing the configuration of a digital input/output portion 36.

The digital input/output portion 36 comprises two IO (Input-Output) ports 61 and 62 contained in the microcomputer 30 and a parallel interface unit 70 including three ports 71, 72, and 73, as shown in FIG. 7.

In the IO ports 61 and 62, input/output can be set for each of all bits composing each of the ports. In the ports 71, 72 and 73 in the unit 70, input/output can be set for each of upper four bits of each of the ports 71, 72, and 73 and lower four bits of the port 73.

An output of the IO port 61 is used for lighting an LED (Light Emitting Diode) on the LED display portion 33. The upper four bits of the port 72 are used as an interruption corresponding input.

[4] Description of Communication Pattern

The following three types are known as a communication pattern among the PC 11, the I/F board 12 and the packed battery 1 (the microcomputer 3 for controlling communication and charge or discharge)

(1) Communication Pattern A

A communication pattern A is communication which is established in order for the PC 11 to acquire predetermined data from the packed battery 1 by issuing a communication command from the PC 11.

Figure 8:
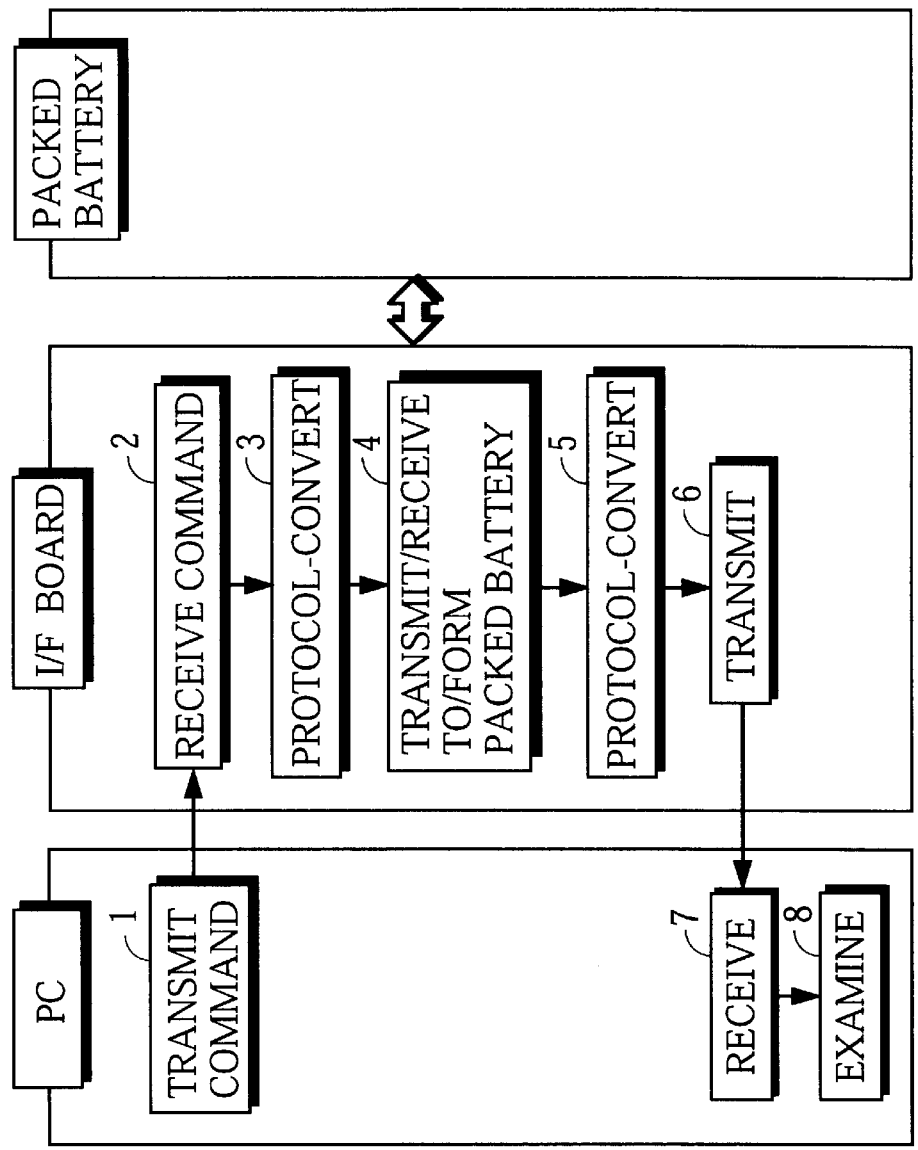
FIG. 8 is a flow chart showing a communication pattern A.

In the communication pattern A, a communication command is first transmitted to the I/F board 12 from the PC 11, as shown in FIG. 8 (step 1). The I/F board 12 protocol-converts, when it receives the communication command (step 2), the received communication command into protocol data corresponding to a designated protocol (step 3), and transmits the obtained protocol data to the microcomputer 3 for controlling communication and charge or discharge in the packed battery 1 (step 4).

The microcomputer 3 for controlling communication and charge or discharge in the packed battery 1 transmits, when it receives the protocol data, data corresponding thereto to the I/F board 12 (step 4). The I/F board 12 protocol-converts, when it receives the data from the microcomputer 3, the received data into a data format which the PC 11 can recognize (step 5), and transmits the obtained data to the PC 11 (step 6). The PC 11 makes, when it receives the data from the I/F board 12 (step 7) examination on the basis of the data (step 8).

(2) Communication Pattern B

Figure 9:
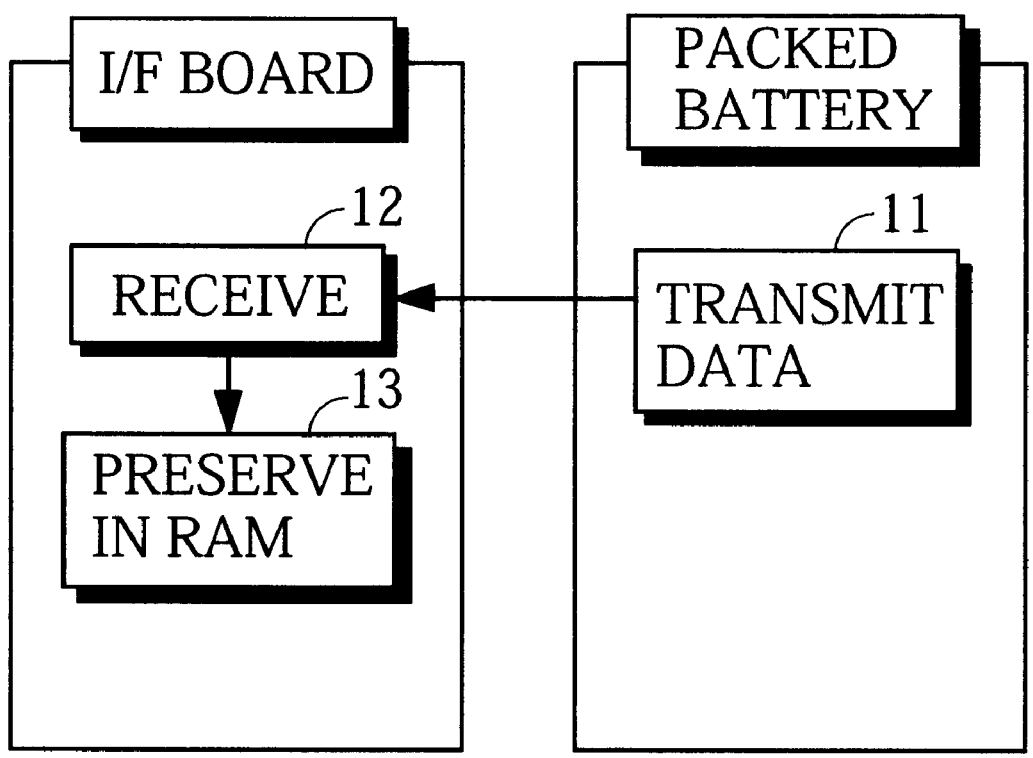
FIG. 9 is a flow chart showing a communication pattern B.

A communication pattern B relates to communication of data which is generated from the packed battery 1 when the packed battery 1 enters a predetermined state. In the communication pattern B, predetermined data is first transmitted to the I/F board 12 from the microcomputer 3 for controlling communication and charge or discharge in the packed battery 1, as shown in FIG. 9 (step 11). The I/F board 12 preserves, which it receives the data from the microcomputer 3 for controlling communication and charge or discharge (step 12), the received data in a RAM (not shown) (step 13).

(3) Communication Pattern C

A communication pattern C is communication which is established in order for the PC 11 to acquire the data which is preserved in the I/F board 12 by the communication pattern B.

Figure 10:
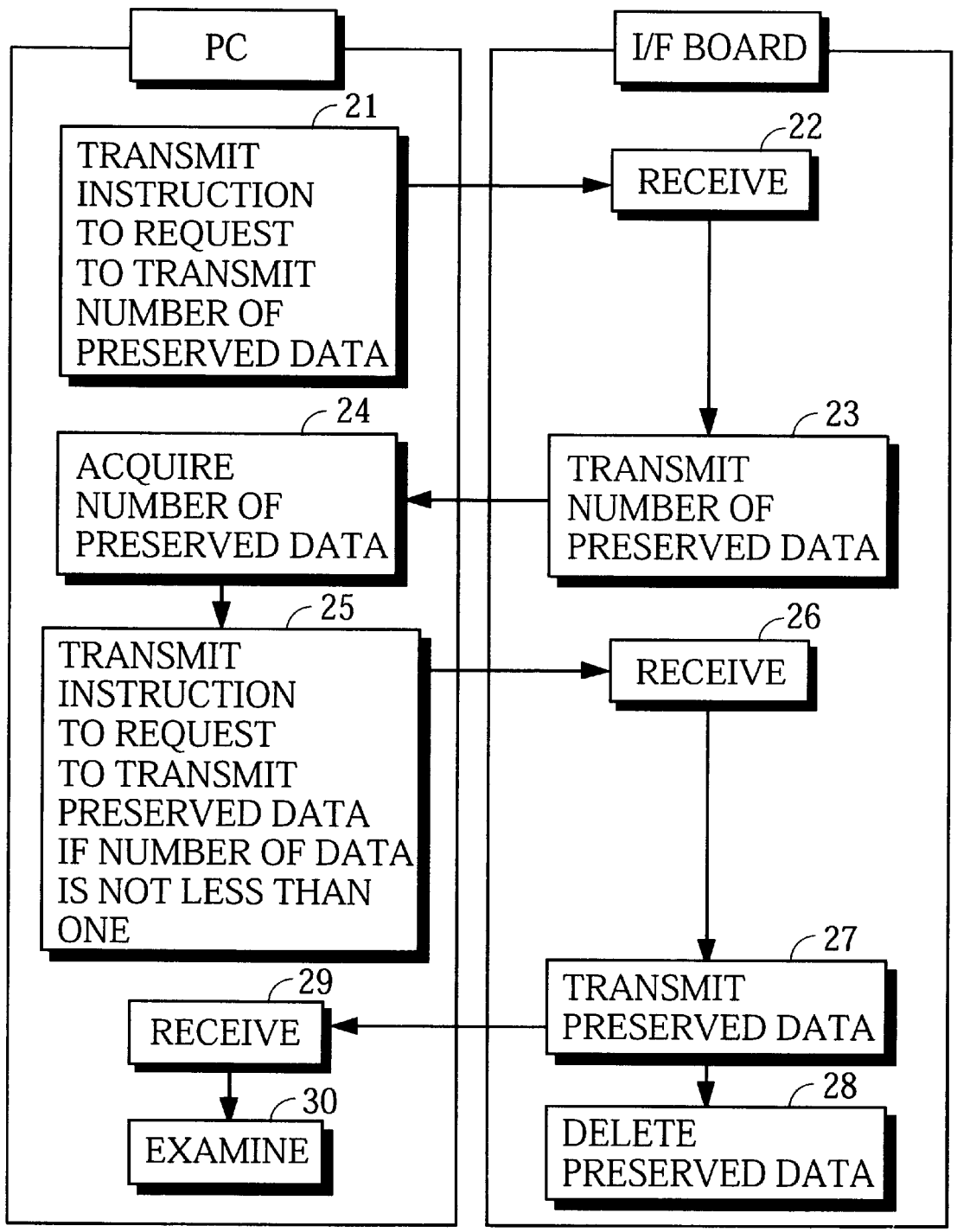
FIG. 10 is a flow chart showing a communication pattern C.

In the communication pattern C, an instruction to request to transmit the number of data which has been received from the packed battery land preserved is first transmitted to the I/F board 12 from the PC 11 (step 21), as shown in FIG. 10. The I/F board 12 transmits, when it receives the instruction (step 22), the number of preserved data to the PC 11 (step 23). The PC 11 acquires the number of data which has been transmitted from the I/F board 12 (step 24). The PC 11 transmits to the I/F board 12, if the acquired number of data is not less than one, an instruction to request to transmit the preserved data to the PC 11 (step 25).

The I/F board 12 protocol-converts, when it receives the instruction (step 26), the preserved data into a data format which the PC 11 can recognize. After the protocol-converted data is transmitted to the PC 11 (step 27), the preserved data is deleted (step 28). The PC 11 makes, when it receives the data from the I/F board 12 (step 29), examination on the basis of the data (step 30).

[4] Description of Examination Procedure

[4-1)] Description of Examination Procedure in Examining Battery Voltage

In the examination of a battery voltage, a battery voltage value obtained by communication (a battery voltage value measured by the microcomputer 3 for controlling communication and charge or discharge which is carried in the packed battery 1) and a battery voltage value measured using the A/D conversion portion 37 in the I/F board 12 are compared with each other, to judge whether or not the microcomputer for controlling communication and charge or discharge normally measures the battery voltage value.

Description is now made of a case where the packed battery which is an examination object is the packed battery for A Company, that is, the type of protocol is the SMB protocol.

(1) Processing Performed by Developing Person.

Description is made of processing performed by a developing person. The developing person operates the PC 11, to create an examination procedure file using a predetermined simple language. An example of instruction words of the simple language is shown in FIG. 11.

The examination procedure file is created for each type of examination. The simple language used for the examination procedure file is common irrespective of the type of packed battery and the type of protocol. For example, a communication command actually transmitted in order for the examining apparatus to acquire the battery voltage value from the microcomputer 3 for controlling communication and charge or discharge which is carried in the packed battery 1 differs depending on the type of packed battery and the type of protocol. In the step of creating the examination procedure file, acommon command "EM IMP Voltage $×2" defined by the simple language is used. An example of the examination procedure file for examining a battery voltage is shown in FIG. 12.

When a battery voltage is examined, the developing person previously designates a protocol used for communication with the packed battery which is an examination object. In this example, the SMB protocol is previously designated. The developing person designates the examination procedure file created for examining a battery voltage. When the examination procedure file created for examining a battery voltage is designated, examination processing based on the designated examination procedure file is started.

(2) Description of Procedure for Battery Voltage Examination Processing.

Figure 13:
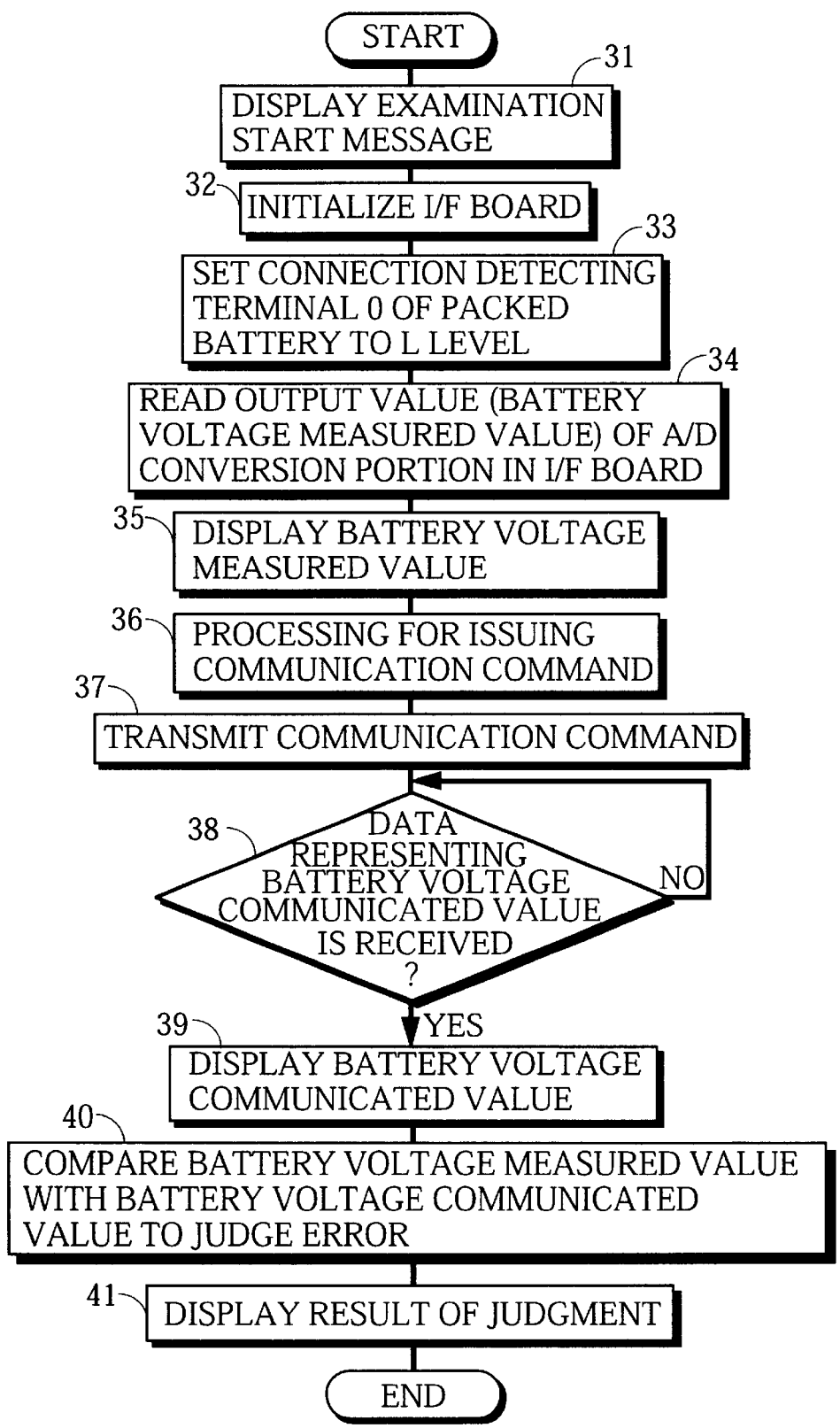
FIG. 13 is a flow chart showing the procedure for battery voltage examination processing.

FIG. 13 shows the procedure for battery voltage examination processing which is performed by the PC 11 on the basis of the examination procedure file for examining a battery voltage as shown in FIG. 12.

Figure 14:
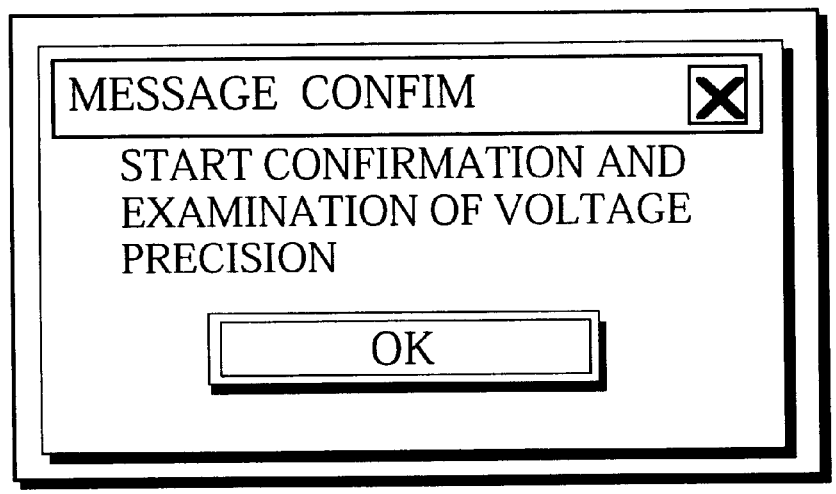
FIG. 14 is a schematic view showing an example of display of an examination start message.

As shown in FIG. 14, an examination start message is first displayed on a monitor of the PC 11 (step 31). When an OK button is clicked on its screen, the I/F board 12 is initialized (step 32).

In the initialization, the following are performed.

① An IC reset request is sent to the CPU 31 in the I/F board 12. Consequently, an IC in the I/F board 12 is reset.

② A communication protocol (the SMB protocol in this example) set in advance is set in the I/F board 12. Consequently, the I/F board 12 grasps a protocol used for communication with the packed battery which is an examination object.

③ A parameter corresponding to the communication protocol set in advance is set in the I/F board 12.

④ Input/output setting of each of the ports in the digital input/output portion 36 in the I/F board 12 is performed.

⑤ A switch in the circuit 42 for feeding a battery voltage of the packed battery 1 in the I/F board 12 to the A/D conversion portion 37 is set on the basis of the communication protocol set in advance, that is, the type of the packed battery. That is, a voltage division ratio of a voltage division circuit in the circuit 42 is determined.

A connection detecting terminal 0 of the packed battery 1 is then set to an L level through the I/F board 12 (step 33). Consequently, the packed battery 1 enters a state where a battery voltage can be examined.

Figure 15:
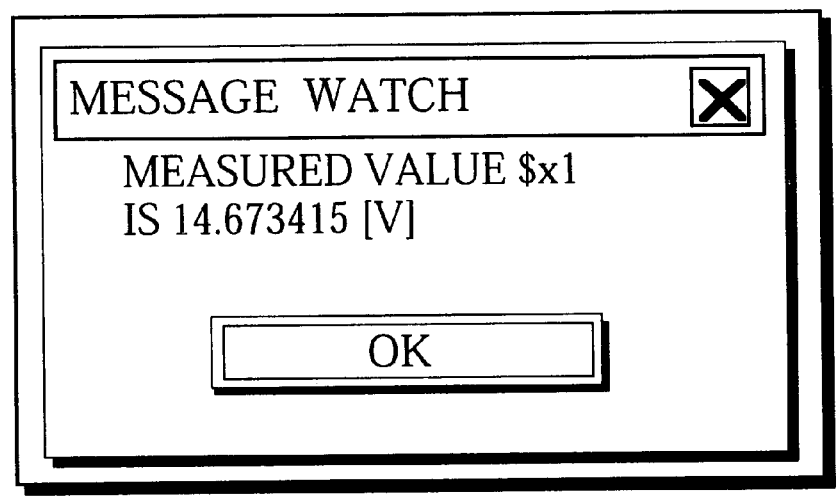
FIG. 15 is a schematic view showing an example of display of a battery voltage measured value.

An output value (a battery voltage measured value) of the A/D conversion portion 37 in the I/F board 12 is then read and stored (step 34). As shown in FIG. 15, the read battery voltage measured value is displayed on the monitor of the PC 11 (step 35).

When the OK button is clicked on the screen, the subsequent instruction described in the examination procedure file is an instruction "EM IBP" for establishing communication to the microcomputer in the packed battery, so that processing for issuing a communication command corresponding to the contents of the communication and a designated protocol is performed (step 36). That is, a communication command corresponding to the designated protocol, that is, such contents of communication that a battery voltage value is acquired from a command definition file corresponding to "SMB" in this example is selected.

The selected communication command is transmitted to the I/F board 12 (step 37). The I/F board 12 protocol-converts, when it receives a communication command for acquiring a battery voltage value, the received communication command into protocol data corresponding to the designated protocol, that is, the SMB protocol in this example, and transmits the obtained protocol data to the packed battery 1. In this example, the SMB protocol is designated, so that the SMB interface portion 53 is used for transmitting or receiving the protocol data.

The microcomputer 3 for controlling communication and charge or discharge in the packed battery 1 transmits, when it receives the protocol data for acquiring the battery voltage value, data representing the battery voltage value measured by the microcomputer 3 (a battery voltage communicated value) to the I/F board 12. The I/F board 12 protocol-converts, when it receives data representing the battery voltage communicated value from the microcomputer 3, the received data into a data format which the PC 11 can recognize, and transmits to the PC 11 the obtained data representing the battery voltage communicated value.

Figure 16:
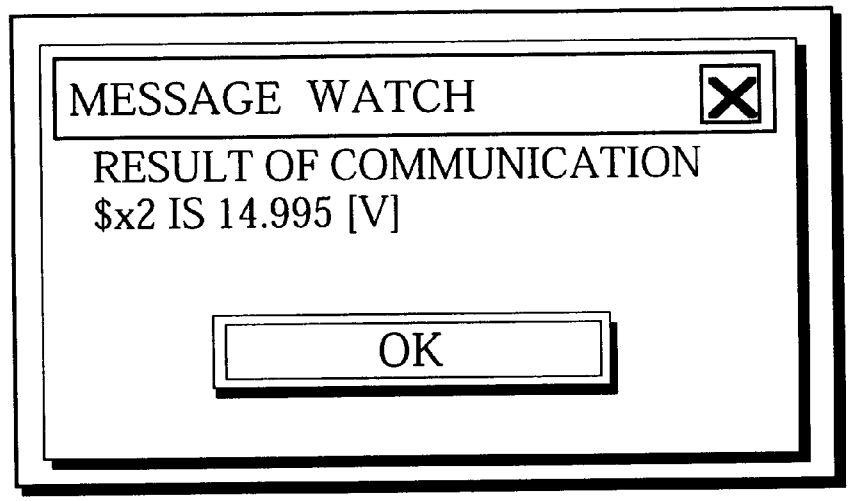
FIG. 16 is a schematic view showing an example of display of a battery voltage communicated value.

When the data representing the battery voltage communicated value from the I/F board 12 is fed (step 38), the received battery voltage communicated value is stored, and is displayed on the monitor of the PC 11, as shown in FIG. 16 (step 39). When the OK button is clicked on the screen, the battery voltage measured value acquired at the step 34 and the battery voltage communicated value acquired at the step 38 are compared with each other, to judge whether or not an error therebetween is within 5%.

Figure 17:
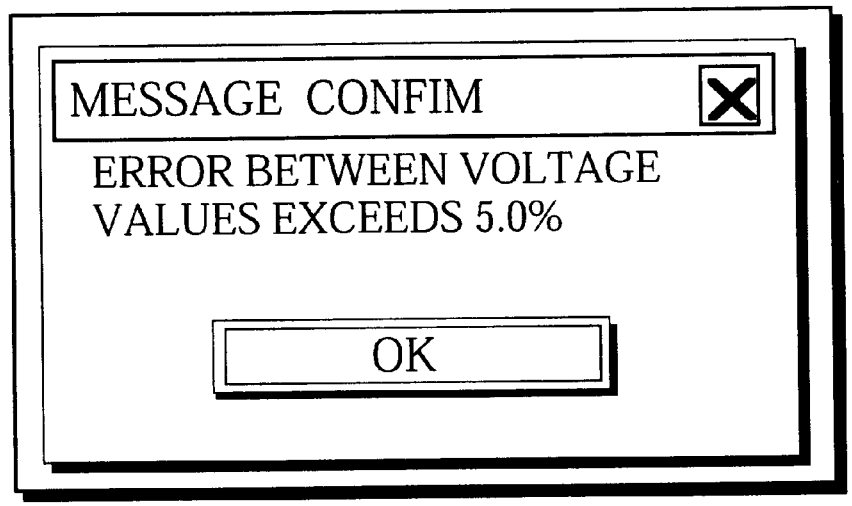
FIG. 17 is a schematic view showing an example of display of the results of judgment.

The results of the judgment are displayed on the monitor of the PC 11 (step 41). A screen displayed when the error between the battery voltage measured value and the battery voltage communicated value exceeds 5% is shown in FIG. 17.

According to the above-mentioned embodiment, packed batteries which differ in the communication command system and the communication protocol can be examined by one examining apparatus.

Since an examination procedure file can be created using a common communication command, an examination procedure file need not be created for each of the packed batteries which differ in the communication command system. Therefore, the examination procedure file is easy to create.

[4-2] Description of Examination Procedure in Confirming and Examining Over Discharge Warning In the confirmation and examination of an over discharge warning, when the remaining capacity of the packed battery 1 is 1000 [mAH] during discharge with a current of 2 [A], it is confirmed whether or not AlarmWarning is issued to the PC 11 from the packed battery 1.

Description is now made of a case where the packed battery which is an examination object is the packed battery for A Company, that is, the type of protocol is the SMB protocol.

(1) Processing Performed by Developing Person.

The developing person operates the PC 11, to create an examination procedure file for confirming and examining an over discharge warning using a predetermined simple language. An example of the examination procedure file for confirming and examining an over discharge warning is shown in FIG. 18.

When an over discharge warning is confirmed and examined, the developing person previously designates a protocol used for communication with the packed battery which is an examination object. In this example, the SMB protocol is previously designated. Further, the developing person designates an examination procedure file created for confirming and examining an over discharge warning. When the examination procedure file created for confirming and examining an over discharge warning is designated, examination processing based on the designated examination procedure file is started.

(2) Description of Procedure for Over Discharge Warning Confirmation and Examination Processing.

Figure 19:
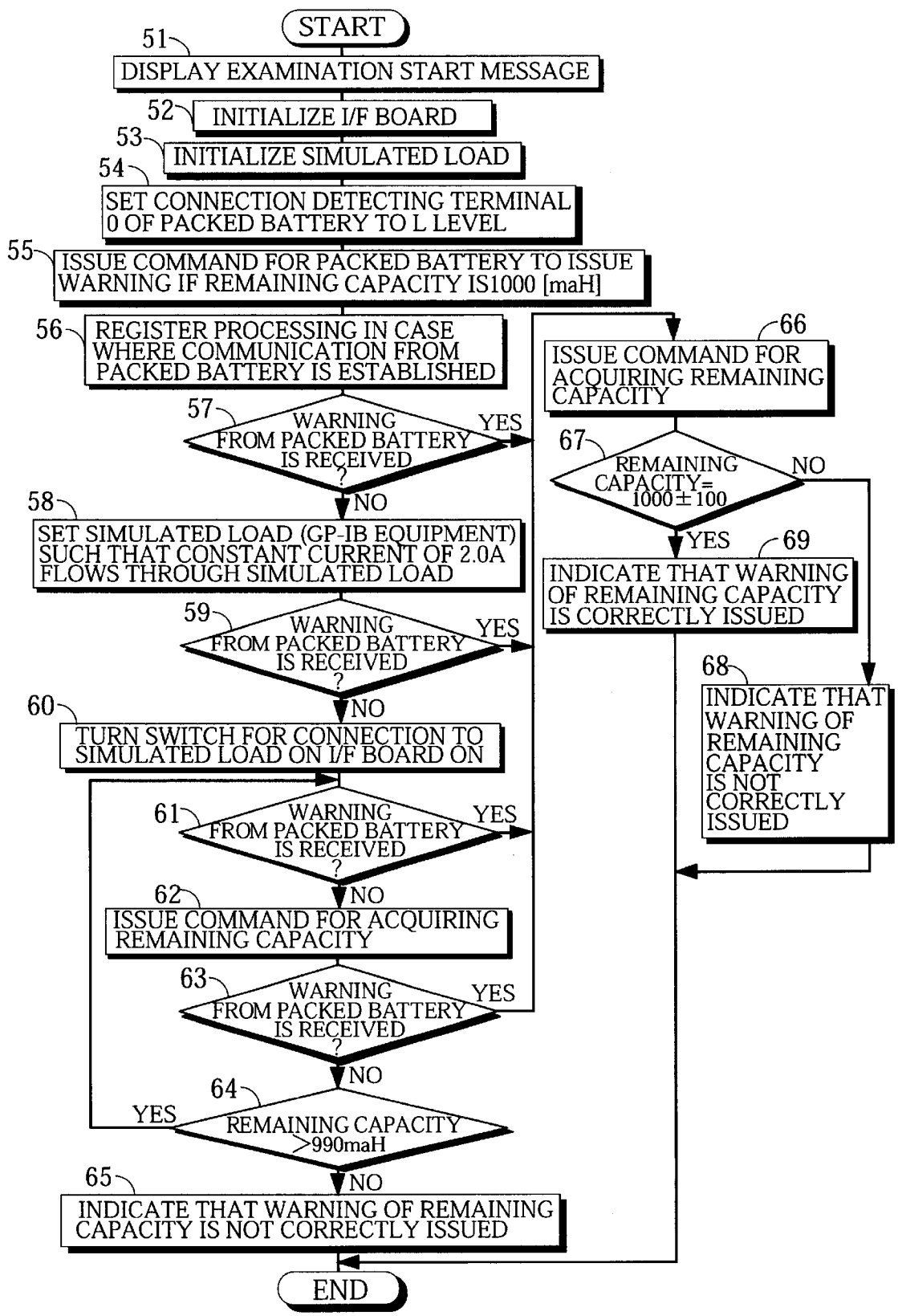
FIG. 19 is a flow chart showing the procedure for over discharge warning confirmation and examination processing.

FIG. 19 shows the procedure for over discharge warning confirmation and examination processing which is performed by the PC 11 on the basis of the examination procedure file for confirming and examining an over discharge warning shown in FIG. 18.

An examination start message indicating that the confirmation and examination of an over discharge warning are started is displayed on the monitor of the PC 11 (step 51). When the OK button is clicked on the screen, the I/F board 12 is initialized, as at the step 32 shown in FIG. 13 (step 52).

The simulated load (a GP-IB equipment) 14 is then initialized (step 53). The connection detecting terminal 0 of the packed battery 1 is set to an L level through the I/F board 12 (step 54).

If the remaining capacity of the packed battery 1 is 1000 [mAH], an instruction for the microcomputer 3 for controlling communication and charge or discharge in the packed battery 1 to issue a warning is then issued (step 55). The instruction is sent to the packed battery 1 through the I/F board 12 by the communication pattern A, and is set in the microcomputer 3 for controlling communication and charge or discharge.

After the setting, when the remaining capacity of the packed battery 1 is 1000 [mAH], the microcomputer 3 for controlling communication and charge or discharge issues a warning (AlarmWarning) by the communication pattern B, and transmits the warning to the I/F board 12. The I/F board 12 preserves, when it receives the warning from the microcomputer 3 for controlling communication and charge or discharge, the warning in a RAM (not shown).

When the processing at the foregoing step 55 is performed, processing performed when the warning (AlarmWarning) from the packed battery 1 is received is registered (step 56). When the registration is conducted, communication by the communication pattern C is automatically established between instructions written in the procedure for examination.

The communication by the communication pattern C is established, to judge whether or not the warning (AlarmWarning) from the packed battery 1 is received.

If the warning (AlarmWarning) from the packed battery 1 is not received, the simulated load 14 is set such that a constant current of 2.0 [A] flows through the simulated load 14 (step 58).

The communication by the communication pattern C is established, to judge whether or not the warning (AlarmWarning) from the packed battery 1 is received (step 59).

If the warning (AlarmWarning) from the packed battery 1 is not received, a switch in the circuit 43 for connecting the cells in the packed battery 1 to the simulated load 14 is turned on at the time of discharge examination in the I/F board 12 (step 60).

The communication by the communication pattern C is established, to judge whether or not the warning (AlarmWarning) from the packed battery 1 is received (step 61)

If the warning (AlarmWarning) is not received from the packed battery 1, a command for acquiring the remaining capacity is issued from the packed battery 1 (step 62). The command is sent to the packed battery 1 through the I/F board 12 by the communication pattern A, and data representing the remaining capacity is fed to the PC 11 from the packed battery 1 through the I/F board 12.

The communication by the communication pattern C is established, to judge whether or not the warning (AlarmWarning) from the packed battery 1 is received (step 63).

If the warning (AlarmWarning) from the packed battery 1 is not received, it is judged whether or not the remaining capacity of the packed battery 1 acquired on the basis of the command issued at the foregoing step 62 is more than 990 [mAH] (step 64)

When the remaining capacity of the packed battery 1 is more than 990 [mAH], the program is returned to the step 61. Consequently, the processing at the steps 61 to 64 is generally repeated.

When it is judged that the remaining capacity of the packed battery 1 is not more than 990 [mAH] at the foregoing step 64 without receiving the warning (AlarmWarning) from the packed battery 1, it is indicated that the warning (AlarmWarning) is not correctly issued (step 65), so that the examination processing is terminated.

When the warning (AlarmWarning) from the packed battery 1 is received at the steps 57, 59, 61 or 63, a command for acquiring the remaining capacity from the packed battery 1 is issued (step 66). The command is sent to the packed battery 1 through the I/F board 12 by the communication pattern A, and data representing the remaining capacity is fed to the PC 11 from the packed battery 1 through the I/F board 12.

It is judged whether or not the remaining capacity of the packed battery 1 is within a range of 1000±100 [mAH] on the basis of the obtained data (step 67). When the remaining capacity of the packed battery 1 is not within the range of 1000±100 [mAH], it is indicated that the warning (AlarmWarning) is not correctly issued (step 68), so that the examination processing is terminated.

When the remaining capacity of the packed battery 1 is within the range of 1000±100 [mAH], it is indicated that the warning (AlarmWarning) is correctly issued (step 69), so that the examination processing is terminated.

Figure 20:
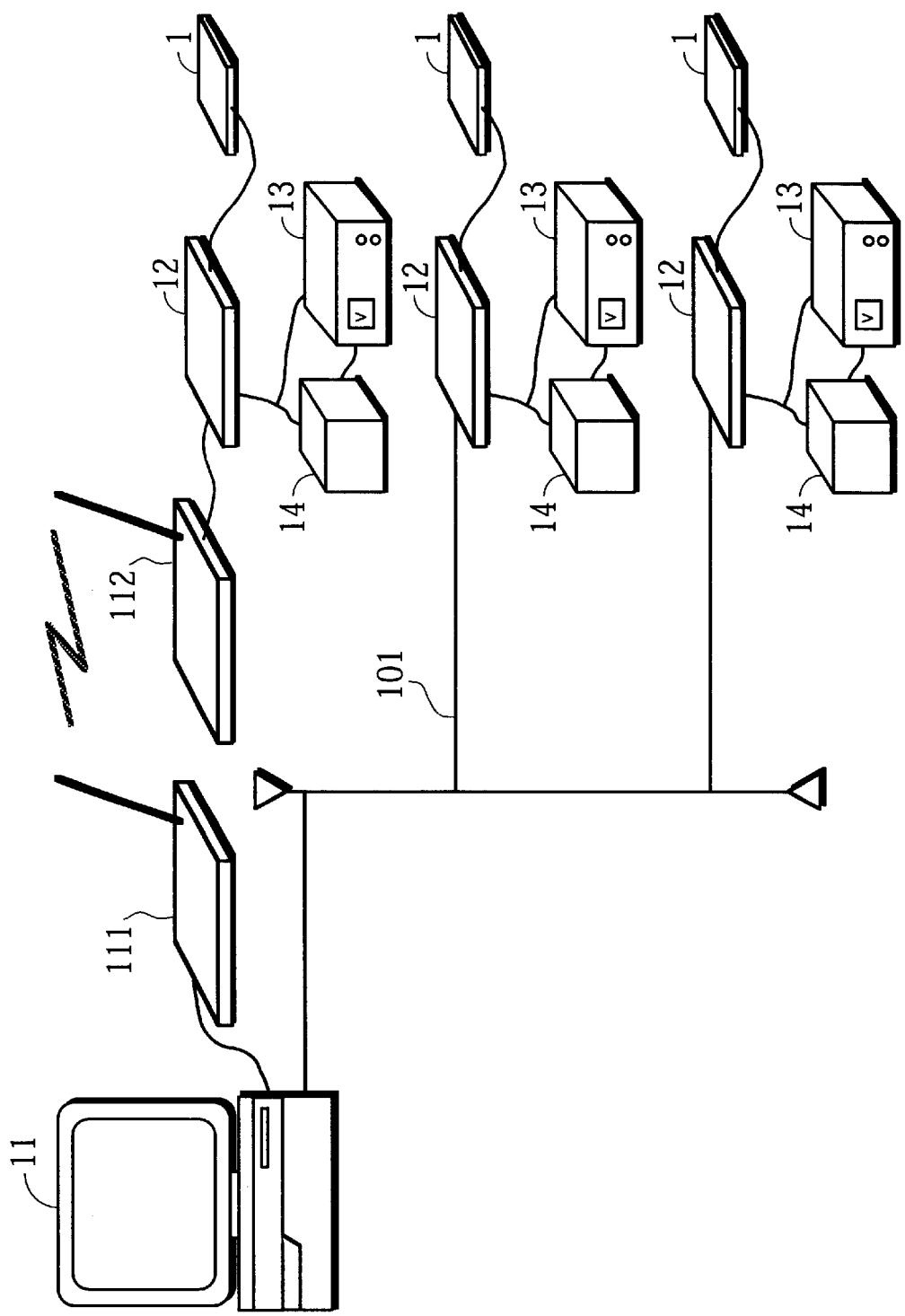
FIG. 20 is a schematic view showing a system for simultaneously examining a plurality of packed batteries by one PC 11.

As shown in FIG. 20, a plurality of packed batteries can be also simultaneously examined by one PC 11.

An IF board 12, a power supply 13, and a simulated load 14 are provided for each of the plurality of packed batteries. Different addresses are previously assigned, respectively, to the IF boards 12.

Communication from the PC 11 to each of the IF boards 12 is established by Internet 101 or radio. When the communication from the PC 11 to the IF board 12 is established by radio, transmitter-receivers 111 and 112 are respectively connected to the PC 11 and the IF board 12.

When the plurality of packed batteries 1 are examined on the side of the PC 11, an application for examination is activated for each of the IF boards 12. A communication command between the PC 11 (each of the applications for examination) and each of the IF boards 12 includes an address assigned to the IF board 12, so that communication of a command and data is established between each of the applications for examination and the corresponding IF board 12.

A dedicated IC (a communication facility chip) may be used in place of the microcomputer 3 for controlling communication and charge or discharge in the packed battery 1.

What is claimed is:

1. A packed battery examining apparatus comprising an interface device connected to a packed battery which is an examination object and a controller connected to the interface device for performing examination processing, wherein the controller comprises means for transmitting to the interface device, when predetermined data for examination must be acquired from a communication and charge or discharge controller in the packed battery which is an examination object in the step of performing the examination processing, a communication command for acquiring the data for examination, and the interface device comprises means for converting, when it receives the communication command for acquiring the data for examination from the controller, the received communication command into protocol data corresponding to a communication protocol used for communication with the packed battery which is an examination object, means for transmitting the obtained protocol data to the communication and charge or discharge controller in the packed battery which is an examination object, and means for receiving the data for examination which has been fed from the communication and charge or discharge controller in the packed battery and transmitting the data for examination to the controller.

2. The packed battery examining apparatus according to claim 1, characterized in that the controller performs the examination processing in accordance with an examination procedure file for defining the procedure for examination processing, and the communication command for acquiring the predetermined data for examination from the communication and charge or discharge controller in the packed battery which is an examination object is described by a common communication instruction irrespective of the type of the packed battery in the examination procedure file, and the controller stores communication command systems respectively corresponding to a plurality of types of packed batteries which are to be examination objects, converts, when the communication instruction described in the examination procedure file is transmitted to the interface device, the communication instruction into a communication command corresponding to the command system corresponding to the packed battery which is an examination object, and transmits the obtained communication command to the interface device.

3. A packed battery examining apparatus comprising an interface device connected to a packed battery which is an examination object and a controller connected to the interface device for performing examination processing, wherein a communication and charge or discharge controller in the packed battery which is an examination object comprises means for generating, when the packed battery which is an examination object enters a predetermined state, data for state confirmation indicating that the packed battery enters the predetermined state, the controller comprises means for transmitting, when the data for state confirmation which is generated by the communication and charge or discharge controller in the packed battery which is an examination object must be acquired in the step of performing the examination processing, a communication command for acquiring the data for state confirmation to the interface device, and the interface device comprises means for receiving and holding data for examination which is generated from the communication and charge or discharge controller in the packed battery which is an examination object, and means for transmitting, when it receives the communication command for acquiring the data for state confirmation from the controller, the preserved data for state confirmation to the controller.

4. The packed battery examining apparatus according to any one of claims 1, 2 and 3, wherein the controller is constituted by a personal computer.

5. The packed battery examining apparatus according to any one of claims 1, 2 and 3, wherein the controller and the interface device are constituted by the same personal computer.

* * * * *